United States Patent
Wu et al.

(10) Patent No.: US 9,437,262 B2
(45) Date of Patent: Sep. 6, 2016

(54) MEMORY CONTROLLER AND ASSOCIATED SIGNAL GENERATING METHOD

(71) Applicant: MStar Semiconductor, Inc., Hsinchu Hsien (TW)

(72) Inventors: Zong-Han Wu, Zhubei (TW);
Chen-Nan Lin, Taipei (TW);
Chung-Ching Chen, Zhubei (TW);
Yung Chang, Hsinchu (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 268 days.

(21) Appl. No.: 14/311,502

(22) Filed: Jun. 23, 2014

(65) Prior Publication Data
US 2014/0379976 A1 Dec. 25, 2014

(30) Foreign Application Priority Data
Jun. 25, 2013 (TW) .............................. 102122579 A

(51) Int. Cl.
*G11C 7/22* (2006.01)
*G11C 8/18* (2006.01)
*G06F 13/16* (2006.01)
*G11C 11/4076* (2006.01)

(52) U.S. Cl.
CPC ............. *G11C 7/22* (2013.01); *G06F 13/1689* (2013.01); *G11C 11/4076* (2013.01)

(58) Field of Classification Search
CPC ..... G11C 7/22; G11C 7/222; G11C 11/4076; G06F 13/1689
See application file for complete search history.

(56) References Cited

U.S. PATENT DOCUMENTS

2004/0081011 A1* 4/2004 Maruyama ............ G11C 11/406
365/233.1
2014/0043925 A1* 2/2014 Lin ...................... G11C 7/1045
365/193

FOREIGN PATENT DOCUMENTS

CN 102117244 A 7/2011

* cited by examiner

*Primary Examiner* — John Lane
(74) *Attorney, Agent, or Firm* — Edell, Shapiro & Finnan, LLC

(57) ABSTRACT

A memory controller and an associated signal generating method are provided. A generating sequence of commands is properly arranged to enlarge latching intervals of an address signal and a bank signal for stable access of a DDR memory module.

20 Claims, 5 Drawing Sheets

MEMORY CONTROLLER AND ASSOCIATED SIGNAL GENERATING METHOD

This application claims the benefit of Taiwan application Serial No. 102122579, filed Jun. 25, 2013, the subject matter of which is incorporated herein by reference.

BACKGROUND OF THE INVENTION

1. Field of the Invention

The invention relates in general to a memory field, and more particularly to a memory controller and an associated signal generating method.

2. Description of the Related Art

A memory controller, generally connected to a memory module, writes data into the memory module or reads data from the memory module. One of the most common memory modules is a double data rate (DDR) memory module.

FIG. 1A and FIG. 1B show a schematic diagram of a connection relationship and an eye diagram of control signals between a memory controller and a memory module, respectively. A memory controller 100 and a DDR memory module 110 are disposed on a printed circuit board (PCB). Control signals include a clock signal CLK1, address signals A[15:0], a command signal CMD, and bank control signals BANK[2:0]. The command signal CMD includes a write enable signal WE, a row address strobe RAS, and a column address strobe CAS. The bank control signals BANK[2:0] are respectively present at 3 pins, and the address signals A[15:0] are respectively present at 16 pins.

The memory controller 100 utilizes the control signals to control and access the DDR memory module 110, e.g., to read and write data. The DDR memory module 110 latches data in the address signals A[15:0], the command signal CMD and the bank control signals BANK[2:0] according to a signal edge (e.g., a rising edge or a falling edge) of the clock signal CLK1. Thus, the memory controller 100 needs to appropriately adjust the phase of the clock signal CLK1, so that the DDR memory module 100 is allowed to successfully latch the data in all of the control signals according to the signal edge of the clock signal CLK1. For illustration purposes, in the example in the description below, the rising edge of the clock signal CLK1 is utilized to latch the signals.

As shown in FIG. 1B, a period of the clock signal CLK1 is T, and periods of the address signals A[15:0], the command signal CMD and the bank control signals BANK[2:0] are also T. However, as driving capabilities of the control signals are different, latching intervals (or referred to as effective data ranges) of the control signals are smaller than T. Therefore, to prevent the control signals from latching these control signals outside the latching intervals and thus from causing errors, the memory controller 100 needs to adjust the rising edge of the clock signal CLK1 to within the latching intervals of these control signals.

As shown in FIG. 1B, the rising edge of the clock signal CLK1 is adjusted to the latching interval Eye_cmd of the command signal CMD, the latching interval Eye_bank of the bank control signals BANK[2:0], and the latching interval Eye_addr of the address signals A[15:0]. It is apparent that the latching intervals of the above signals are all smaller than T. More particularly, having a large number of signals, the address signals A[15:0] has the smallest latching interval Eye_addr.

As the access speed of dynamic random access memories (DRAMs) continue to increase, DDR2 modules have evolved to DDR3 and DDR4 modules. However, with the increasing speed of memory modules, signal quality is significantly lowered. On further account of variations of PCBs and different pins of the memory modules of different specifications, slight differences may exist in the time that control signals need to travel from the memory controller to the memory module, and the rising time and falling time when signals are changed may be different. As a result, the latching intervals of the control signals become even smaller.

FIG. 2A and FIG. 2B show a schematic diagram of a connection relationship and an eye diagram of control signals between a memory controller and two memory modules, respectively. When controlling two DDR memory modules 210 and 220 by a memory controller 200, a first clock signal CLK1 connects to the first DDR memory module 210, and a second clock signal CLK2 connects to the second DDR memory module 220. Further, the two DDR memory modules 210 and 220 share address signals A[15:0], a command signal CMD, and bank control signals BANK[2:0]. That is, the first DDR memory module 210 latches the data in the address signals A[15:0], the command signal CMD and the bank control signals A[15:0] according to the first clock signal CLK1; the second DDR memory module 220 latches the data in the address signals A[15:0], the command signal CMD and the bank control signals BANK[2:0] according to the second clock signal CLK2.

The memory controller 200 is required to drive a pin count that is twice of that of the memory in FIG. 1A. In addition, considering variations of PCBs and different pins of the two DRAMs, the quality of the signals is further deteriorated. Such signal deterioration is particularly severe for the address signals A[15:0]. Compared to FIG. 1B, the latching intervals in FIG. 2B are even smaller, and particularly the latching interval Eye_addr of the address signals A[15:0] is extremely small. That is, with the extremely small latching interval Eye_addr of the address signals A[15:0], it is made even more challenging for the memory controller 200 to make adjustment to provide appropriate phases for the clock signals CLK1 and CLK2 that allow the two DDR memory modules 210 and 220 to successfully latch the signals.

Under high-speed requirements, the quality of all of the signals cannot be easily qualified. Therefore, there is a need for a solution that overcomes the above issues.

SUMMARY OF THE INVENTION

The invention is directed to a memory controller and an associated signal generating method. By limiting the method for generating a command signal and expanding latching intervals of a part of address signals, memory modules are enabled to operate in a functional manner.

A signal generating method for a memory controller that controls a first memory module is provided by the present invention. The signal generating method includes: generating a first clock signal having a signal period of one unit time; generating a command signal having a signal period of the unit time, the command signal including multiple command groups each having a first command and a second command that are consecutive; generating an address signal set having a signal period of twice of the unit time; setting a first signal edge of the first clock signal to within a latching interval of the command signal; and setting a second signal edge of the first clock signal to within latching intervals of the command signal and the address signal set.

A memory controller that is connected to a first memory module is further provided by the present invention. The memory controller includes: a clock generating unit, configured to generate a first clock signal having a signal period of a unit time to the first memory module; a control signal translating unit, configured to generate a command signal having a signal period of the unit time to the first memory module, the command signal including multiple command groups each having a first command and a second command that are consecutive; and an address translating unit, configured to generate an address signal having a signal period of twice of the unit time to the first memory module. The clock generating unit sets a first signal edge of the first clock signal to within a latching interval of the command signal, and a second signal edge of the first clock signal to within latching intervals of the command signal and the address signal set.

The above and other aspects of the invention will become better understood with regard to the following detailed description of the preferred but non-limiting embodiments. The following description is made with reference to the accompanying drawings.

DETAILED DESCRIPTION OF THE INVENTION

Taking two memory modules for example, control signals include a first clock signal CLK1, a second clock signal CLK2, a command signal CMD, bank control signals BANK[2:0], and address signals A[15:0]. The command signal CMD includes a write enable signal WE, a row address strobe RAS, and a column address strobe CAS. For example, bank control signals at 3 pins are BANK[2:0], and address signals at 16 pins are A[15:0]. Further, when compositions of chips in a memory module are different, the quantities of the control signals may also be different. In other words, the above values of the control signals are examples in an embodiment of the present invention, and are not to be construed as limitations to the present invention.

After receiving the command signal, the DDR memory module accordingly execute commands including a no-operation command NOP, a bank bus pre-charge command PRE, a drive bank bus command ACT, a write command Write and a read command Read.

During the NOP command, the address signals A[15:0] at the 16 pins and the bank control signals BANK[2:0] at the 3 pins are "don't care". That is, when executing the NOP command, data in the address signals A[15:0] and the bank control signals BANK[2:0] is omitted.

In one embodiment, a signal generating method for a memory controller is developed based on characteristics of the NOP command. For example, in the command signal CMD outputted from the memory controller, two commands are grouped into one command group, which sequentially includes a command 1 cmd1 and a command 2 cmd2. Preferably, the command 1 cmd1 can only be the NOP command, whereas the command 2 cmd2 may be any of the above commands.

Figure 1A:
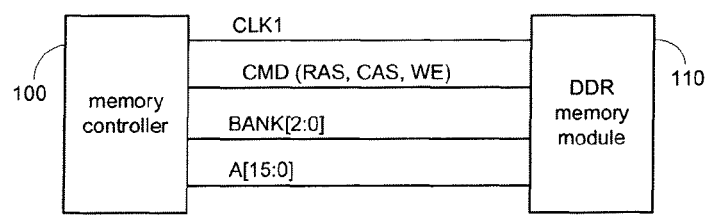
FIG. 1A and FIG. 1B are a connection relationship and an eye diagram of control signals between a memory controller and a memory module, respectively.
Figure 1B:
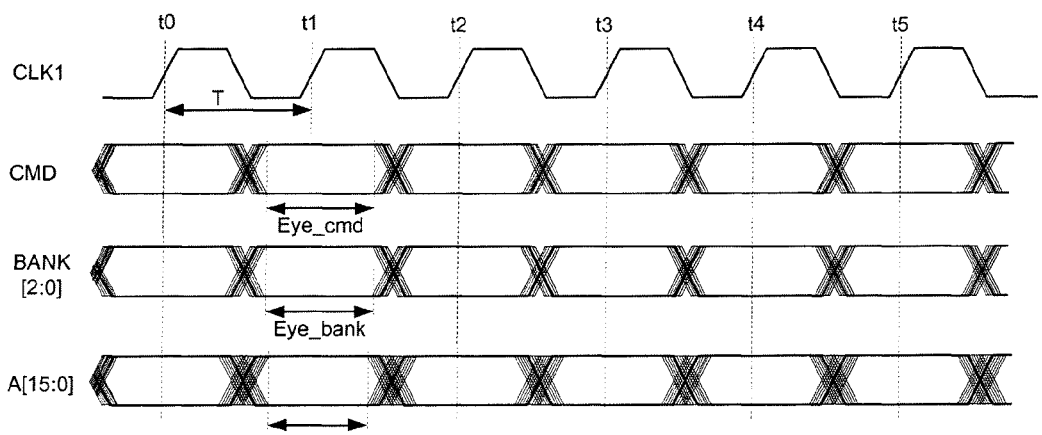
Figure 2A:
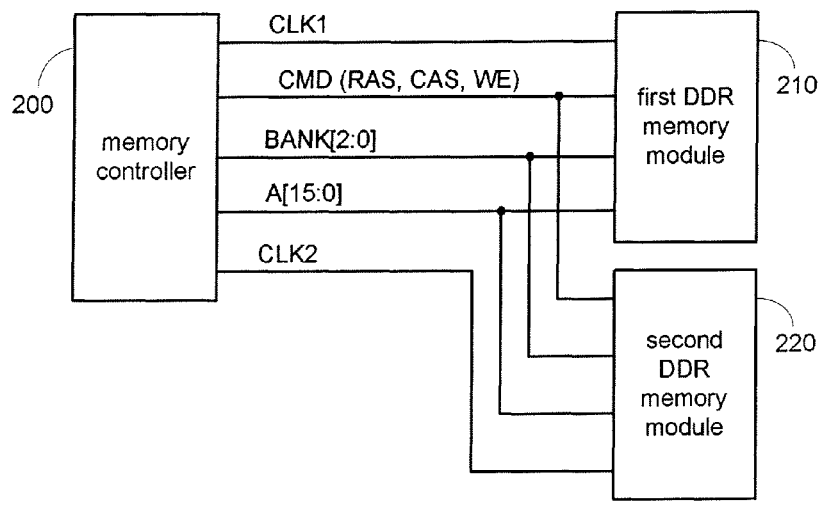
FIG. 2A and FIG. 2B are a connection relationship and an eye diagram of control signals between a memory controller and two memory modules, respectively.
Figure 2B:
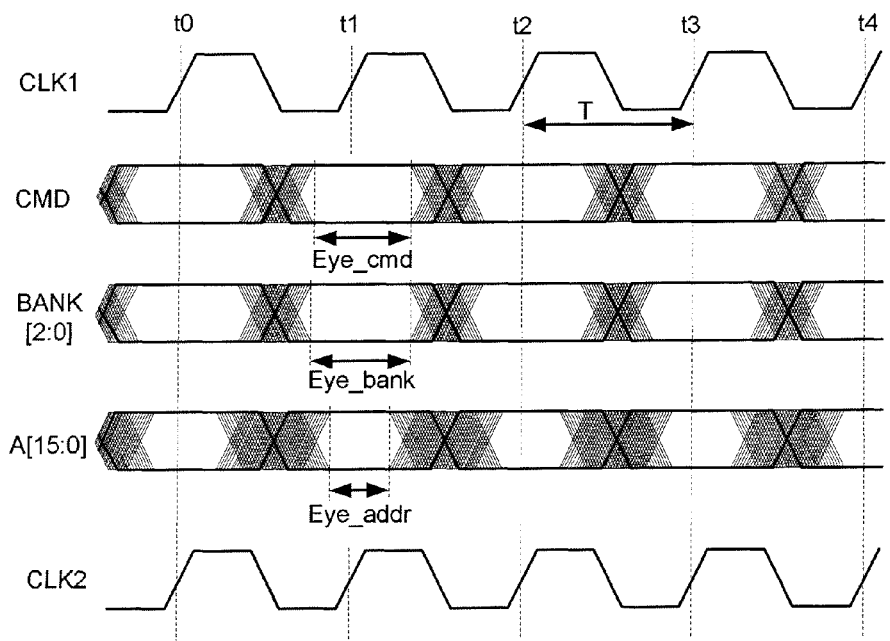
Figure 3A:
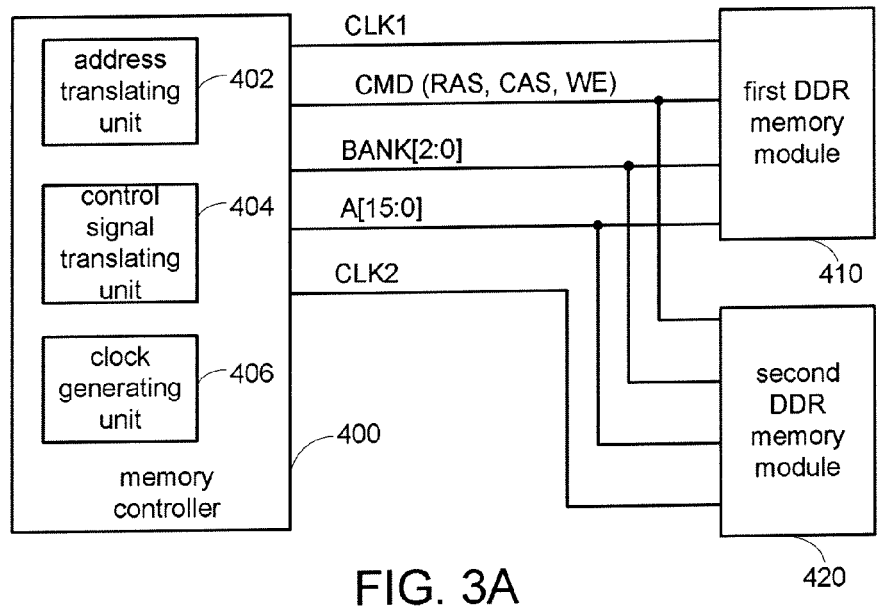
FIG. 3A and FIG. 3B are a connection relationship and an eye diagram of control signals between a memory controller and two memory modules according to an embodiment of the present invention, respectively.
Figure 3B:
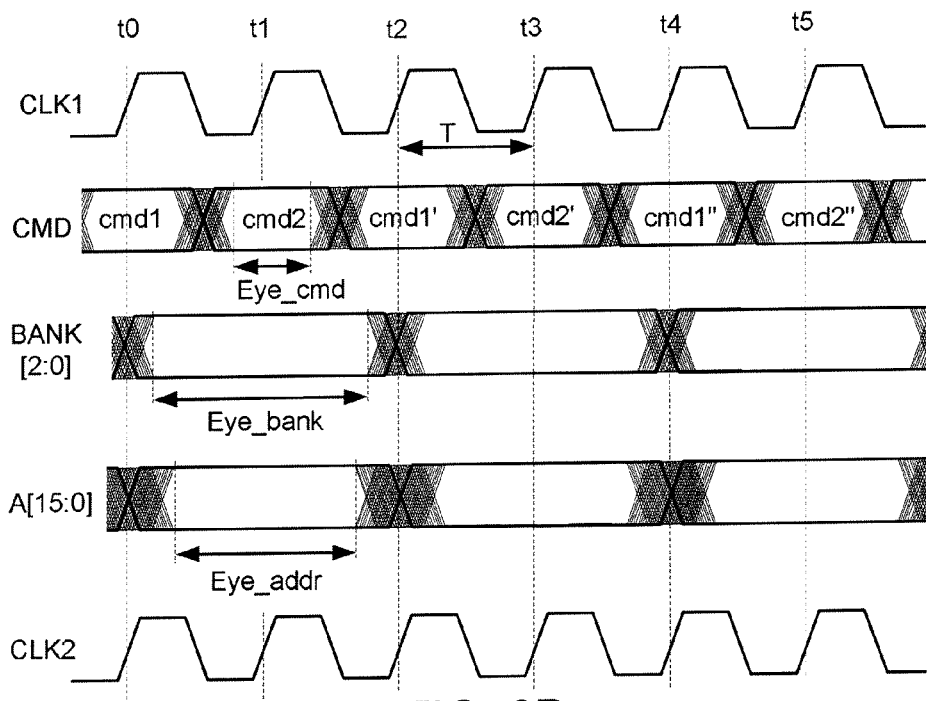

FIG. 3A and FIG. 3B show a schematic diagram of a connection relationship and an eye diagram of control signals between a memory controller and two memory modules according to an embodiment of the present invention, respectively. A memory controller 400 includes an address translating unit 402, a control signal translating unit 404, and a clock generating unit 406. The clock generating unit 406 generates the first clock signal CLK1 and the second clock signal CLK2; the control signal translating unit 404 generates the command signal CMD; and the address translating unit 402 generates the bank control signals BANK[2:0] and the address signals A[15:0]. Depending on the number of DDR memory modules, the clock generating unit 406 may generate individual clock signals to the DDR memory modules, respectively.

As shown in FIG. 3A, the first clock signal CLK1 connects to a first DDR memory module 410, and the second clock signal CLK2 connects to a second DDR memory module 420. Further, the first DDR memory module 410 and the second DDR memory module 420 share the address signals A[15:0], the command signal CMD and the bank control signals BANK[2:0]. That is, the first DDR memory module 210 latches the data in the address signals A[15:0], the command signal CMD and the bank control signals BANK[2:0] according to the first clock signal CLK1; the second DDR memory module 220 latches the data in the address signals A[15:0], the command signal CMD and the bank control signals BANK[2:0] according to the second clock signal CLK2.

In the embodiment, the command signal sent out by the memory controller 400 includes multiple command groups, each of which having two consecutive commands. As shown in FIG. 3B, the first command group is sequentially a command 1 cmd1 and a command 2 cmd2; the second command group is sequentially a command 1' cmd1' and a command 2' cmd2'; the third command group is sequentially a command 1" cmd1" and a command 2" cmd2".

In the embodiment, it is limited that the first command in the command groups can only be the NOP command. When the DDR memory modules 410 and 420 execute the NOP command, data in the address signals A[15:0] and the bank control signals BANK[2:0] is omitted. Preferably, when the memory controller 400 generates the first command of the command group, the rising edges of the first clock signal CLK1 and the second clock signal CLK2 are not limited to fall within the latching intervals Eye_addr and Eye_bank of the address signals A[15:0] and the bank control signals BANK[2:0]. In other words, when the memory controller 400 generates the first command in the command group, even though the rising edges of the first clock CLK1 and the second clock CLK2 fall outside the latching intervals Eye_addr and Eye_bank of the address signals A[15:0] and the bank control signals BANK[2:0], no error will be caused.

Referring to FIG. 3B, periods of the first clock signal CLK1 and the second clock signal CLK2 outputted by the clock generator 406 in the memory controller 400 are T, a signal period of the command signal CMD outputted by the control signal translating unit 404 in the memory controller 400 is T, and signal periods of the bank control signals BANK[2:0] and the address signals A[15:0] outputted by the address translating unit 402 in the memory controller 400 are 2T. It should be noted that, the latching intervals Eye_addr and Eye_bank of the address signals A[15:0] and the bank control signals BANK[2:0] are already enlarged.

As shown in FIG. 3B, at time points t0, t2 and t4 are sequentially the command 1 cmd1 of the first command group, the command 1' cmd1' of the second command group, and the command 1" cmd1" of the third command group. The rising edges of the first clock signal CLK1 and the second clock signal CLK2 are located within the latching interval Eye_cmd of the command signal, but outside the latching intervals Eye_addr of the address signals A[15:0] and Eye_bank 15:0 of the bank control signals BANK[2:0]. That is, although correct data of the address signals A[15:0] and the bank control signals BANK[2:0] cannot be obtained from the commands that the two DDR memory modules 410 and 420 receive at the time points t0, t2 and t4, the two DDR modules 410 and 420 are nonetheless capable of correctly executing the NOP command.

Further, at time points t1, t3 and t5 are sequentially the command 2 cmd2 of the first command group, the command 2' cmd2' of the second command group, and the command 2" cmd2" of the third command group. The rising edges of the first clock signal CLK1 and the second clock signal CLK2 are located within the latching interval Eye_cmd of the command signal CMD, the latching interval Eye_bank of the bank control signals BANK[2:0], and the latching interval Eye_addr of the address signals A[15:0]. It should be noted that, correct data of the address signals A[15:0] and the bank control signals BANK[2:0] can be obtained from the commands that the two DDR memory modules 410 and 420 receive at the time points t1, t3 and t5, and the commands can be correctly executed.

As explained in the above description, in the embodiment, the memory controller is limited to output multiple command groups each having two consecutive commands. The first command is limited to an NOP command. Thus, the signal periods of the address signals A[15:0] and the bank control signals BANK[2:0] can be increased to 2T that further expands the corresponding latching intervals Eye_addr and Eye_bank, thereby more readily latching data of the control signals.

It should be noted that, in the present invention, the number of DDR memory modules is not limit to the exemplary number of two as in the above embodiment. The present invention is applicable for controlling one single DDR memory module or more than two DDR memory modules.

Figure 4A:
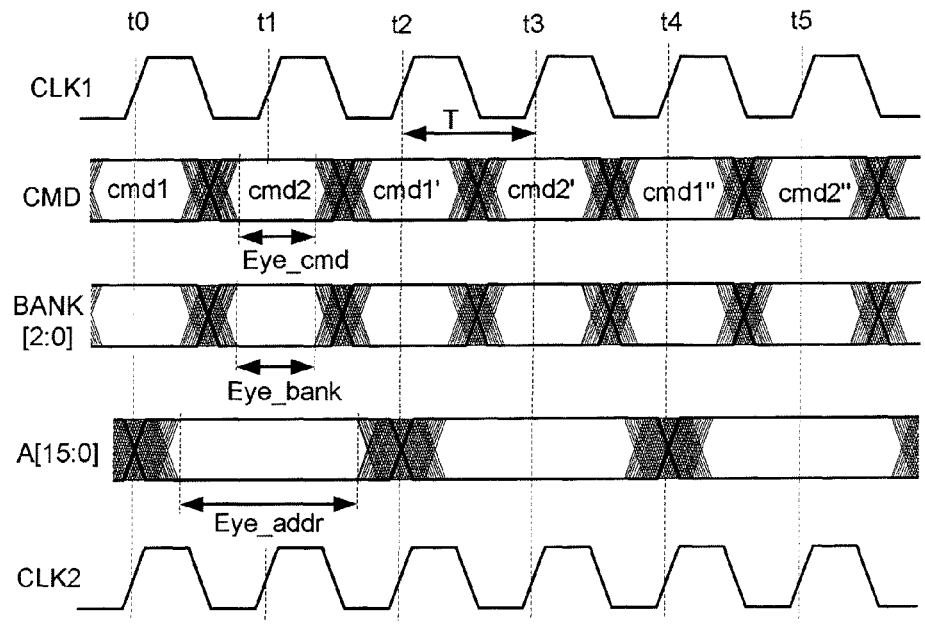
FIG. 4A and FIG. 4B are eye diagrams of control signals between a memory controller and memory module according to other embodiments of the present invention, respectively.

Further, the signal periods of the address signals A[15:0] and the bank control signals BANK[2:0] are not limited to being increased to 2T as in the above embodiment. According to actual requirements, only the signal period of the address signals A[15:0] is increased to 2T while the signal period of the bank control signals BANK[2:0] is maintained at T. FIG. 4A shows a waveform diagram of associated signals.

Figure 4B:
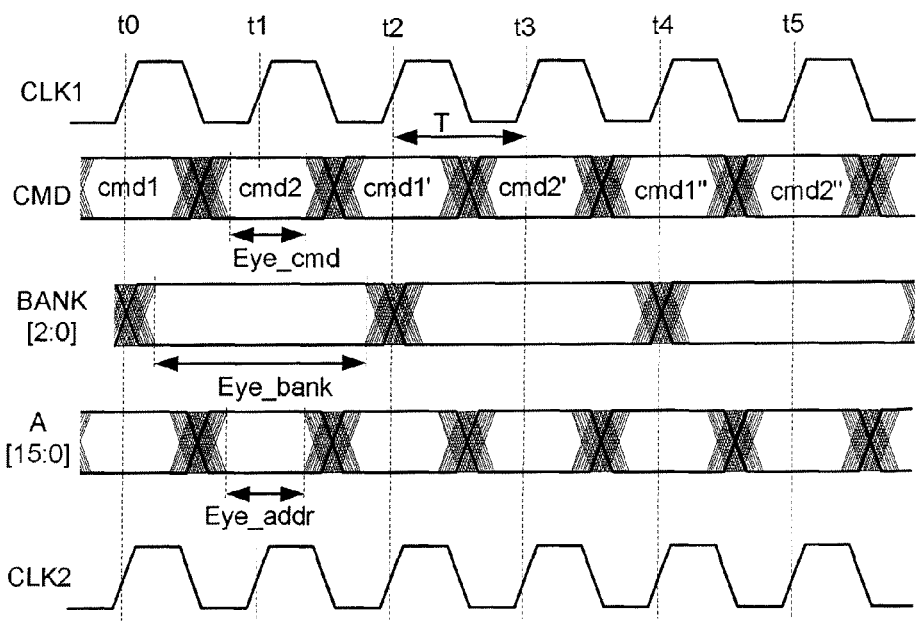

Alternatively, only the signal period of the bank control signals BANK[2:0] is increased to 2T while the signal period of the address signals A[15:0] is maintained at T. FIG. 4B shows a waveform diagram of associated signals.

Figure 5:
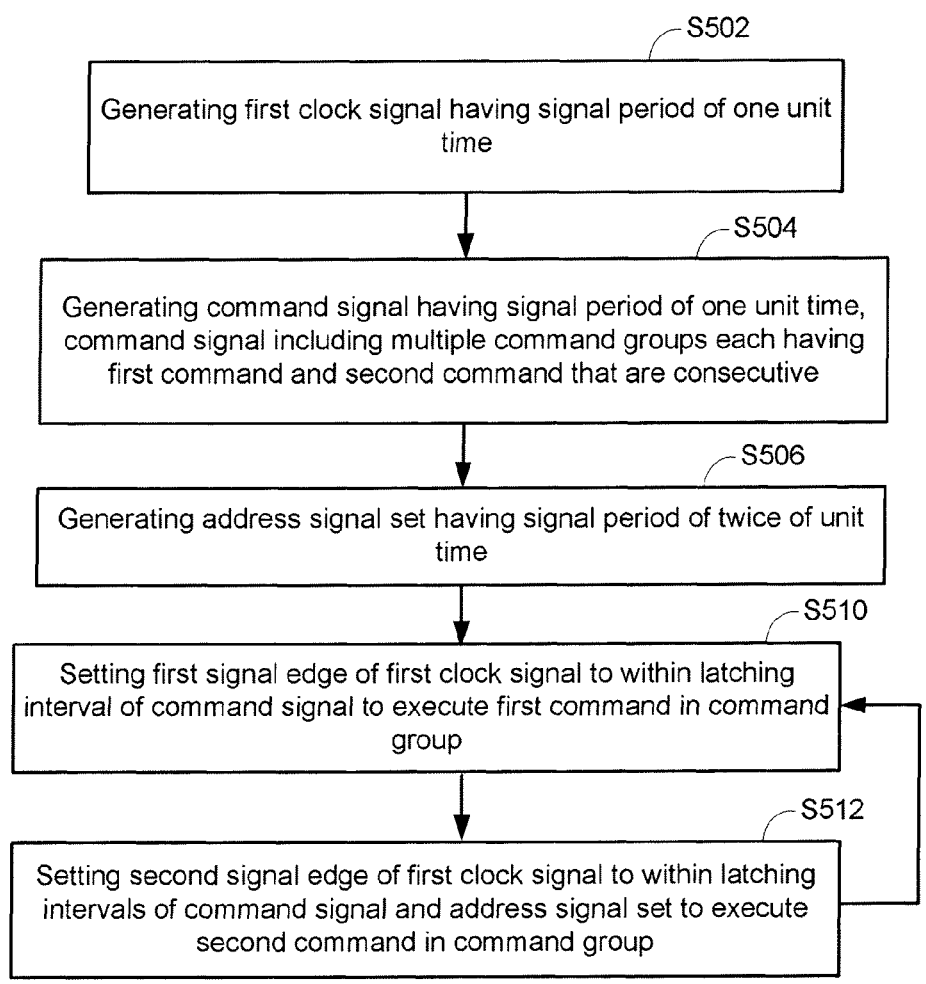
FIG. 5 is a flowchart of a signal generating method of a memory controller according to an embodiment of the present invention.

FIG. 5 shows a flowchart of a signal generating method of a memory controller according to an embodiment of the present invention. In step S502, a first clock signal having a signal period of a unit time is generated. In step S504, a command signal having a signal period of the unit time is generated. The command signal includes multiple command groups, each of which having a first command and a second command that are consecutive. In step S506, an address signal set having a signal period of twice of the unit time is generated. The address signal set may be an address signal set including address signals A[15:0] and/or bank control signals BANK[2:0].

In step S510, the clock generating unit 406 set a first signal edge of the first clock signal to within a latching interval of the command signal, such that the DDR memory module executes the first command. In step S512, a second signal edge of the first clock signal is set to within latching intervals of the command signal and the address signal set, such that the DDR memory module executes the second command.

According to the method in FIG. 5, it means that one command group is completely executed after step S510 and step S512 are performed. When the process returns to step S510, it means that a next command group is executed. The abovementioned unit time is a first clock period, and the first command in the command group is an NOP command.

It is known from the above description that, in the embodiments, with the command group and by lengthening the signal period of the address signals A[15:0] or the bank control signals BANK[2:0] to twice of the unit time, the latching intervals of these signals can be expanded. Thus, not only the memory controller is enabled to control the DDR memory modules in a functional manner to further overcome issues of conventionally small latching intervals, but also system stability and access performance are reinforced as the memory access clock speed continue to increase.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A signal generating method of a memory controller, for controlling a memory module, comprising:
   generating a first clock signal having a signal period of a unit time;
   generating a command signal having a signal period of the unit time, wherein the command signal comprises a plurality of command groups each having a first command and a second command that are consecutive;
   generating an address signal set having a signal period of twice of the unit time;
   setting a first signal edge of the first clock signal to within a latching interval of the command signal;
   setting a second signal edge of the first clock signal to within the latching interval of the command signal and a latching interval of the address signal set; and
   controlling the memory module according to the command signal and the address signal.

2. The signal generating method according to claim 1, for further controlling another memory module, comprising:
   generating a second clock signal having a signal period of the unit time;
   setting a first signal edge of the second clock signal to within the latching interval of the command signal; and
   setting a second signal edge of the second clock signal to within the latching interval of the command signal and the latching interval of the address signal set.

3. The signal generating method according to claim 2, wherein the memory module and the another memory module are double data rate (DDR) memory modules.

4. The signal generating method according to claim 1, wherein the unit time is a period of the first clock signal.

5. The signal generating method according to claim 1, wherein the address signal set comprises an address signal and a bank control signal.

6. The signal generating method according to claim 1, wherein the first command is a no operation command.

7. The signal generating method according to claim 1, wherein the second command is one of a no operation command, a bank bus pre-charge command, a drive bank bus command, a write command and a read command.

8. The signal generating method according to claim 1, wherein the first signal edge of the first clock signal is outside the latching interval of the address signal set.

9. The signal generating method according to claim 1, wherein the first signal edge and the second signal edge of the first clock signal are both rising edges of the first clock signal.

10. The signal generating method according to claim 1, wherein the address signal set is one of an address signal and a bank control signal.

11. The signal generating method according to claim 10, wherein when the address signal set is the address signal, a signal period of the bank control signal is a unit time, and the first signal edge and the second signal edge of the first clock signal are set to within a latching interval of the bank control signal.

12. The signal generating method according to claim 10, wherein when the address signal set is the bank control signal, a signal period of the address signal is a unit time, and the first signal edge and the second signal edge of the first clock signal are set to a latching interval of the address signal.

13. A memory controller, connectable to a memory module, comprising:
a clock generating unit, configured to generate a first clock signal having a signal period of a unit time to the memory module;
a control signal translating unit, configured to generate a command signal having a signal period of the unit time to the memory module, wherein the command signal comprises a plurality of command groups each having a first command and a second command that are consecutive; and
an address translating unit, configured to generate an address signal set having a signal period of twice of the unit time to the memory module;
wherein, the clock generating unit sets a first signal edge of the first clock signal to within a latching interval of the command signal, and sets a second signal edge of the first clock signal to within the latching interval of the command signal and a latching interval of the address signal set.

14. The memory controller according to claim 13, further connectable to another memory module, wherein the clock generating unit generates a second clock signal having a signal period of the unit time, sets a first signal edge of the second clock signal to within the latching interval of the command signal, and sets a second signal edge of the second clock signal to within the latching interval of the command signal and the latching interval of the address signal set.

15. The memory controller according to claim 14, wherein the memory module and the another memory module are both DDR modules.

16. The memory controller according to claim 13, wherein the unit time is a period of the first clock signal.

17. The memory controller according to claim 13, wherein the address signal set comprises an address signal and a bank control signal.

18. The memory controller according to claim 13, wherein the first command is a no operation command.

19. The memory controller according to claim 13, wherein the second command is one of a no operation command, a bank bus pre-charge command, a drive bank bus command, a write command and a read command.

20. The memory controller according to claim 13, wherein the first signal edge of the first clock signal is outside the latching interval of the address signal set.

* * * * *